United States Patent [19]

Marks et al.

[11] Patent Number: 5,423,945
[45] Date of Patent: Jun. 13, 1995

[54] SELECTIVITY FOR ETCHING AN OXIDE OVER A NITRIDE

[75] Inventors: Jeffrey Marks; Kenneth S. Collins, both of San Jose; Chan-Lon Yang, Los Gatos; David W. Groechel, Sunnyvale; Peter R. Keswick, Newark, all of Calif.

[73] Assignee: Applied Materials, Inc., Santa Clara, Calif.

[21] Appl. No.: 941,501

[22] Filed: Sep. 8, 1992

[51] Int. Cl.⁶ .......................................... H01L 21/00
[52] U.S. Cl. .................................................. 156/662.1
[58] Field of Search ............... 156/643, 646, 662, 653, 156/657

[56] References Cited

U.S. PATENT DOCUMENTS

| | | | |
|---|---|---|---|
| 4,368,092 | 1/1983 | Steinberg et al. | 156/345 |
| 4,377,438 | 3/1983 | Moriya et al. | 156/643 |
| 4,401,054 | 8/1983 | Matsuo et al. | 118/723 |
| 4,492,620 | 1/1985 | Matsuo et al. | 204/192 R |
| 4,511,430 | 4/1985 | Chen et al. | 156/643 |
| 4,675,073 | 6/1987 | Douglas | 156/643 |
| 4,711,698 | 12/1987 | Douglas | 156/643 |
| 4,778,561 | 10/1988 | Ghanbari | 156/643 |
| 4,807,016 | 2/1989 | Douglas | 156/643 |
| 4,918,031 | 4/1990 | Flamm et al. | 437/225 |
| 4,948,458 | 8/1990 | Ogle | 156/643 |
| 5,091,326 | 2/1992 | Haskell | 437/43 |
| 5,286,344 | 2/1994 | Blalock et al. | 156/643 |

FOREIGN PATENT DOCUMENTS

| | | |
|---|---|---|
| 050972 | 5/1982 | European Pat. Off. |
| 265584 | 5/1988 | European Pat. Off. |
| 57-210631 | 12/1982 | Japan |
| 60-111474 | 6/1985 | Japan |
| 02062038 | 3/1990 | Japan |

OTHER PUBLICATIONS

"Selective Reactive Ion Etch For Silicon Oxide Over Silicon Nitride, Using Carbon Tetrafluoride And Methylene Trifluoride As Etch Gasses"; RD–301059; May 10, 1989; abstract only.

"Increasing the Etch Rate Ratio of $SiO_2$/Si in Fluorocarbon Plasma Etching"; Coburn, IBM Tech. Disclosure; 1977; p. 3854; vol. 19; No. 10; Mar. 1977.

"Gas Mixing To Prevent Polymer Formation During Reactive Ion Etching"; IBM Tech Disclosure; Bondur et al.; 1979; p. 4816; vol. 21, No. 10.

Machida et al., "$SiO_2$ Planarization Technology with Biasing and Electron Cyclotron Resonance Plasma Deposition for Submicron Interconnections," *Journal Vacuum Science and Technology B*, vol. 4, 1986, pp. 818–821.

Primary Examiner—R. Bruce Breneman
Assistant Examiner—George Goudreau
Attorney, Agent, or Firm—Birgit E. Morris; Charles S. Guenzer

[57] ABSTRACT

A method of etching an oxide over a nitride with high selectivity comprising plasma etching the oxide with a carbon and fluorine-containing etchant gas in the presence of a scavenger for fluorine, thereby forming a carbon-rich polymer which passivates the nitride. This polymer is inert to the plasma etch gases and thus provides high selectivity to the etch process.

22 Claims, 1 Drawing Sheet

SELECTIVITY FOR ETCHING AN OXIDE OVER A NITRIDE

This invention relates to an etch process for etching an oxide over a nitride. More particularly, this invention relates to etching silicon oxide over silicon nitride with high selectivity.

BACKGROUND OF THE INVENTION

A significant challenge in semiconductor fabrication is to etch away a silicon oxide layer, or a portion thereof, over a nitride layer, e.g., silicon nitride, with high selectivity for the oxide layer. Since both oxide and nitride materials generally etch at about the same rate in an etch plasma, a process of providing additional selectivity must be found.

When a fluorine-substituted hydrocarbon is used as an etchant, the fluorine reacts with the carbon present to form a passivating coating of a carbon-fluorine polymer which forms over the substrate. However, this polymer is dissociated by oxygen atoms formed during the etch of the oxide layer. Thus as the silicon oxide continues to etch, the nitride layer etches at a much slower rate due to the presence of the passivating coating. However, the passivating layer is also attacked by free fluorine atoms present in the plasma, and thus the nitride also continues to be etched. Thus a selectivity over about 8:1 of silicon oxide to silicon nitride has not been achieved to date.

Since for state of the art devices having submicron dimensions, i.e., VLSI and ULSI devices, selectivity of over about 10:1. and even 30:1 and 40:1 are required, it would be highly desirable to provide an etch process for etching oxides over nitrides with high selectivities of over 10:1.

SUMMARY OF THE INVENTION

We have found that when a scavenger for fluorine is added to fluorine-substituted hydrocarbon etch gases for an oxide layer over a nitride, a carbon-rich polymer is deposited onto the nitride which does not dissociate in the presence of oxygen. The result is almost infinite etch selectivity between the oxide and the nitride.

DETAILED DESCRIPTION OF THE INVENTION

Figure 1:
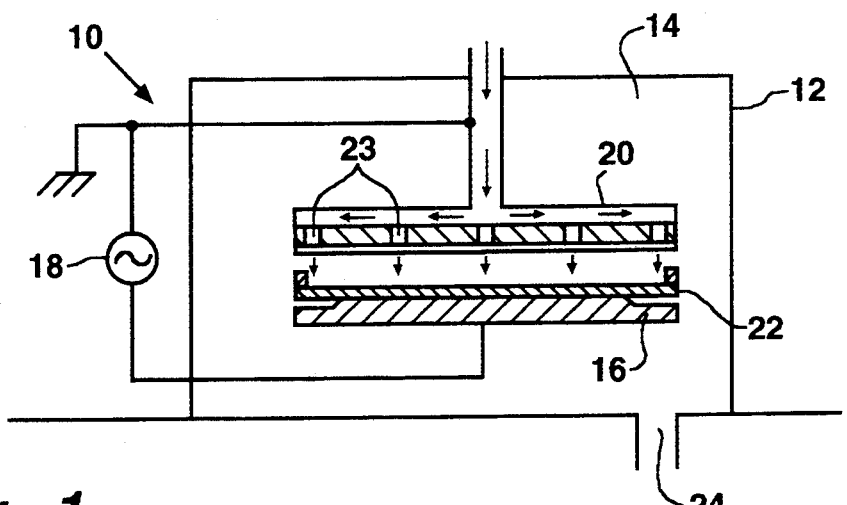
FIG. 1 is a cross sectional view of a conventional etch apparatus.

FIG. 1 is a cross sectional view of a conventional etch chamber 10. A housing 12, made of aluminum for example, defines an etch chamber 14. The substrate 22 to be processed, such as a silicon wafer, is supported on an electrode support 16. The support 16 is generally the cathode. The interior walls of the housing 12 are generally the anode. The cathode 16 is connected to a source of RF power 18. A gas manifold 20 connected to a source of process gas (not shown) is opposite and closely spaced from the cathode support 16. The process gas is directed towards the substrate 22 as it exits the gas manifold 20 by means of a series of orifices 23 in the gas manifold 20. When RF power is applied to the substrate support 16 and the process gases are fed to the manifold 20, a plasma is formed in the space between the manifold 20 and the substrate 22. An exhaust line 24 connected to a vacuum pump (not shown) maintains the pressure in the chamber and evacuates spent gases and reaction products.

Although the exact mechanism for the present process is unknown, we believe the following discussion illustrates the process of the invention.

Generally when a fluorocarbon etch gas, such as $CF_4$, $C_2F_6$, $C_3F_8$, $CH_2F_4$ and the like, that contains both carbon and fluorine is exposed to a plasma, various fragments are generated in the plasma, including free fluorine atoms, CF and $CF_2$ radicals and the like. The fluorine is available to etch silicon oxides on a substrate. However, during the course of the etch process, a polymer of carbon and fluorine is also formed, that deposits onto the substrate, forming a passivating layer. The polymer contains about 30% by weight of carbon and about 60% by weight of fluorine. Such polymers are attacked by oxygen atoms, and thus the oxygen atoms from the oxide layer will dissociate the polymer as it is formed, without interfering with the etch of the oxide. However, when no oxygen is present, such as when a non-oxygen-containing layer is reached, i.e., a nitride layer, there is no oxygen to dissociate the passivating polymer layer. At that point silicon oxide will continue to etch and the passivated nitride layer will etch at a slower rate. However, the passivating polymer is also dissociated by fluorine, and the continual formation of fluorine ions in the plasma will bombard and otherwise attack the polymer layer as well, causing the polymer to dissociate, whereupon the nitride layer will be etched as well by the plasma. Thus the maximum selectivity of an oxide over nitride achieved up till now has been about 8:1.

However, we have found that reducing the fluorine content of the passivating polymer, and reducing the amount of free fluorine in the plasma, reduces the dissociation of the passivating polymer. Thus if a scavenger for fluorine, such as a source of silicon ions or graphite is contacted with the plasma, free silicon atoms or carbon atoms combine with fluorine atoms, such as to form $SiF_4$, thus reducing the number of free fluorine ions in the plasma. The polymer deposited onto the nitride layer thus has less fluorine atoms or more carbon atoms and a "carbon-rich" polymer results. A carbon-rich polymer is defined for the present purposes as a polymer that contains less than about 40% by weight of fluorine and over about 50% by weight of carbon and is inert to fluorine-containing plasma etchants. Thus when a carbon-rich polymer is deposited onto a nitride layer, almost no decomposition or reaction of the carbon-rich polymer occurs, in turn providing an almost infinite selectivity for an oxide layer over a nitride.

A source of silicon can be provided in several ways; for example, a silicon-containing gas, such as silane ($SiH_4$), a substituted silane such as diethyl silane ($SiH_2(C_2H_4)_2$, $SiF_4$ and the like and tetraethylorthosilicate (hereinafter TEOS) can be added to the plasma. The silicon-containing gas decomposes to form free silicon ions which will scavenge free fluorine atoms. Thus a carbon-rich carbon-fluorine polymer coating forms on the nitride layer.

Another method of forming a carbon-rich carbon-fluorine polymer is by suspending a source of silicon, i.e., a silicon mesh, in the plasma area. A source of silicon, e.g., a silicon wafer, can also be suspended within the reaction chamber but outside of the plasma area, but in that case it must be heated to a temperature that will form free silicon atoms in the reactor to scavenge fluorine atoms, e.g., a temperature of 150° or higher. In that case a means of regulating the temperature of the silicon source will also have to be provided in the reaction chamber.

A preferred method of forming a carbon-rich carbon-fluorine polymer is carrying out the present process in a novel etch reactor described in copending application Ser. No. 07/824,856, filed Jan. 24, 1992 to Collins et al. That application describes an RF powered plasma etch chamber containing a source of free silicon, which can be for example a third electrode made of silicon or other source of free silicon in contact with the plasma, such as a silicon liner in the chamber walls. The third electrode can also be made of graphite as a source of carbon atoms that can scavenge fluorine also.

Figure 2:
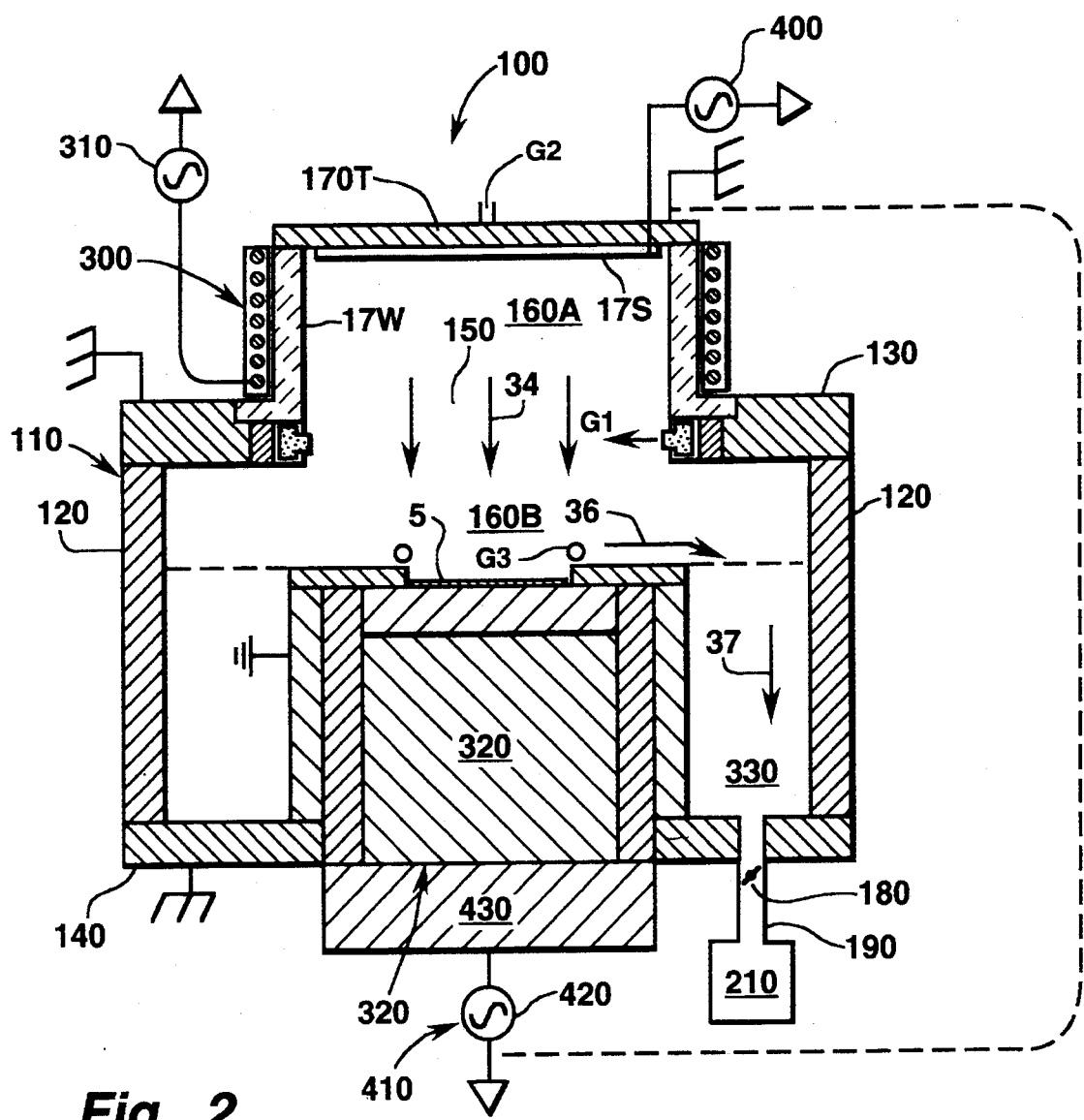
FIG. 2 is a cross sectional view of a preferred etch apparatus.

Referring to FIG. 2, a reactor system 100 includes a vacuum chamber housing 110, formed of anodized aluminum or other suitable material, having sidewalls 120 and top and bottom walls 130 and 140 respectively. A top wall 130 has a central opening 150 between a lower chamber substrate processing section 160B defined between walls 120—120 and an upper chamber plasma source section 160A defined by a dome 170. The dome 170 may be configured as an inverted single or double walled cup which is formed of a dielectric, such as quartz.

The evacuation of the interior of the chamber housing 110 (chamber 160) is controlled by a throttle valve 180 in a vacuum line 190 which is inserted in the bottom wall 140 and connects to a vacuum pumping system 210 comprising one or more vacuum pumps.

Process gases can be supplied to the chamber 110 by three manifold injection sources, G1, G2 and G3 located respectively at the base of the source region 160A, at the dome 170 and peripherally about the substrate 5 to be etched. The overall gas glow is along path 34 from the chamber source region 160A toward the substrate 5 and along path 36 from the substrate 5 to the outlet manifold 330 and along path 37 from the outlet manifold 330 to the vacuum system 210.

RF energy is supplied to the dome 170 by a source comprising an antenna 300 of at least one turn or coil which is powered by an RF supply and matching network 310. The antenna 300 is tuned to resonance for efficient inductive coupling with the plasma source. A plasma is generated in the dome 170 concentrated in the small volume defined within the coil antenna 300. Active species, including ions, electrons, free radicals and excited neutrals, move toward the substrate 5 to be etched by diffusion and by bulk flow due to the gas flow generated by the gas manifold system G1, G2 and G3. A bias energy input arrangement 410, comprising a source 420 and a bias matching network 430, couples RF energy to the substrate support electrode 320 for selectively increasing the plasma sheath voltage at the substrate, and thus selectively increasing the ion energy at the substrate.

The chamber 110 incorporates a unique, three-electrode arrangement which gives the novel process control described herein. The substrate support electrode 320 comprises a cathode, the chamber side walls 120 comprises the anode and a third electrode is the dome top plate 170T. This top electrode may be floating, grounded or connected to an RF power supply 400 and is preferably made of silicon or a silicon-containing alloy, or graphite. It can also be a sacrificial silicon member 170S such as a silicon wafer. This application is herein incorporated by reference.

Etch processes in a vacuum chamber can be carried out at pressures generally from about 0.1 millitorr to about 200 millitorr, but generally etch processes are carried out preferentially at about 5 millitorr to about 50 millitorr. At these comparatively high pressures, close spacing of the gas manifold and the substrate to be etched, for example spacing of about 5 cm (2 in.) is highly desirable since it reduces the voltage requirement, eliminating one possible cause of damage to the substrate devices, and increases the uniformity of etching.

The preferred etchants herein are $CF_4$, $C_2F_6$ and $C_3F_8$, which generate only carbon ions and fluorine ions. Other known fluoride etchants, such as $CHF_3$ are less preferred because they also generate hydrogen ions, which makes for a "dirtier" process.

The reaction products of silicon and fluorine generally form volatile silicon-fluorine compounds that can be readily removed from the etch chamber by the exhaust system. However, if the source of silicon, e.g., silicon electrode, becomes coated with a carbon-fluorine polymer over time, the polymer may be removed and the reactor cleaned by heating the affected parts to elevated temperature, or by sputter etching the polymer from the affected parts in known manner, so as to remove the polymer and expose the free silicon again to the plasma.

Thus in accordance with the invention, very high selectivity between an oxygen-containing layer, such as silicon oxide, and a non-oxygen-containing layer, such as silicon nitride, can be obtained, almost up to infinity, by regulating the fluorine content of the plasma and reducing the fluorine content of the passivating polymer deposited. These polymers are sensitive to oxygen and fluorine, but when no oxygen is present, such as when the etchant has reached a nitride layer, and a reduced amount of fluorine is present in the plasma, little if any decomposition of the polymer takes place.

The invention will be further described in the following examples, but the invention is not means to be limited to the details described therein.

EXAMPLE 1

A silicon wafer having a layer of silicon oxide about 5000–10,000 angstroms thick over a silicon nitride layer deposited by PECVD, was etched in an RF etch chamber as described above with respect to FIG. 2, using a grounded third electrode made of silicon as the source of silicon in the chamber. The etch gas was $C_2F_6$ at a pressure of about 2–30 millitorr; source power of 2000 watts; bias voltage of 200 volts; top electrode 170T with a silicon disk 170S mounted thereto and biased by RF energy of 2 MHz and 1000 watts.

The selectivity of the oxide over the nitride was 15:1.

EXAMPLE 2

The process of Example 1 was repeated except that the nitride layer was deposited by LPCVD.

The selectivity of oxide over nitride was 15:1.

The selectivity can be adjusted by changing gas flows, source power and the like to optimize the selectivity of silicon oxide over silicon nitride on a particular substrate and the like, as will be known to one skilled in the art. Almost infinite selectivity can be achieved by use of the present process.

Although the invention has been described in terms of specific embodiments, the invention is not limited to a particular source of silicon or to a particular etch chamber. Other variations will be known to those skilled in the art and are meant to be included herein. The invention is only to be limited by the scope of the appended claims.

We claim:

1. A process for etching an oxide layer over a nitride layer in an upper portion of a substrate with high etching selectivity for said oxide, comprising etching said substrate in a plasma derived from a carbon- and fluorine-containing gas and contacted to a scavenger for fluorine aside from said substrate and from said carbon- and fluorine-containing gas and comprising a constituent selected from the group consisting of silicon and carbon.

2. A process according to claim 1 wherein said oxide is silicon oxide.

3. A process according to claim 1 wherein said nitride is silicon nitride.

4. A process according to claim 1 wherein said etching step forms a carbon-rich passivating carbon-fluorine polymer over the nitride layer and wherein said carbon-rich polymer contains less than about 40% by weight of fluorine and more than about 50% by weight of carbon.

5. A process according to claim 1 wherein said scavenger for fluorine is a source of silicon aside from said substrate.

6. A process according to claim 1 wherein said source of silicon is elemental silicon in contact with the plasma.

7. A process according to claim 5 wherein said scavenger for fluorine is a silicon-containing gas.

8. A process according to claim 7 wherein said silicon-containing gas is selected from the group consisting of silane, a substituted silane and tetraethylorthosilicate.

9. A process according to claim 1 wherein said scavenger for fluorine is graphite in contact with the plasma.

10. A process according to claim 1 wherein said scavenger for fluorine is disposed above a top surface of said substrate.

11. A process according to claim 10 wherein said scavenger for fluorine is included within a body.

12. A process according to claim 11 wherein said body is an electrically controlled electrode.

13. A process according to claim 11 wherein said body is apart from principal means for creating said plasma.

14. A process according to claim 11 further comprising inductively inducing said plasma through a coil antenna and electrically biasing said body containing said scavenger for fluorine.

15. A process according to claim 11 wherein said scavenger for fluorine comprises silicon and further comprising inductively inducing said plasma through a coil antenna and electrically biasing said body containing said scavenger for fluorine.

16. A process according to claim 1, wherein said scavenger for fluorine is included within a body.

17. A process according to claim 1 wherein said selectivity is at least 15:1.

18. A process according to claim 11, wherein said scavenger for fluorine included within said body comprises silicon.

19. A process according to claim 18, further comprising maintaining said body at a temperature of 150° C. or higher.

20. A process according to claim 11, wherein said scavenger for fluorine included within said body comprises graphite.

21. An etch process selective to an oxide over a nitride, comprising the steps of:

exposing to a fluorocarbon plasma a substrate comprising an oxide layer over a nitride layer to thereby etch said oxide layer; and contacting said fluorocarbon plasma to a solid source of silicon overlying said substrate.

22. An etch process according to claim 20, further comprising:

coupling RF energy into said fluorocarbon plasma through a coil antenna; and applying additional RF energy to said solid source of silicon.

* * * * *